United States Patent [19]

Schlater

[11] Patent Number: 4,829,293
[45] Date of Patent: May 9, 1989

[54] METHOD AND APPARATUS FOR ACHIEVING VARIABLE AND INFINITE PERSISTENCE

[75] Inventor: Rodney T. Schlater, Colo Spgs., Colo.

[73] Assignee: Hewlett-Packard Company, Palo Alto, Calif.

[21] Appl. No.: 731,413

[22] Filed: May 6, 1985

[51] Int. Cl.⁴ .............................................. G09G 1/16
[52] U.S. Cl. .................................. 340/722; 340/744; 340/747; 324/121 R
[58] Field of Search ............... 340/722, 747, 723, 744; 324/88, 121 R, 121 E; 364/487

[56] References Cited

U.S. PATENT DOCUMENTS

| | | |
|---|---|---|
| 3,972,026 | 7/1976 | Waitman et al. |
| 4,134,149 | 1/1979 | Nord .................................... 340/731 |
| 4,142,146 | 2/1979 | Schumann et al. ............. 324/121 R |
| 4,295,135 | 10/1981 | Sukonick ............................ 340/734 |
| 4,464,656 | 8/1984 | Nakamura ......................... 340/734 |
| 4,504,827 | 3/1985 | Hanson et al. ...................... 340/744 |
| 4,634,970 | 1/1987 | Payne ................................. 340/720 |

Primary Examiner—Gerald L. Brigance
Attorney, Agent, or Firm—Karl E. Bring

[57] ABSTRACT

Method and apparatus for achieving unlimited and variable presistence in a digital oscilloscope having a samplier, analog-to-digital converter, high speed memory, microprocessor, linked list memory, display memory with bits corresponding to pixels on a raster display screen and hardware for refreshing the screen from memory. Variable persistence controls the length of time waveform data persists on a display. Waveform data persists indefinitely with unlimited persistence. For unlimited persistence, analog data is acquired by the sampler, converted to digital, stored in high speed memory, converted to coordinates corresponding to appropriate pixels, and corresponding display memory bits are set. For variable persistence, linked lists are maintained for each column on the display screen, each link containing a row coordinate and time remaining before erasing variable. Acquired data is converted to coordinates, lists are searched, new links from a spare links pool are added to the lists for new points, and time remaining variables are reset for old points. Time remaining variables are decremented at intervals, links are removed from the lists and returned to the spare links pool when time remaining variables reach zero, and corresponding bits in display memory are cleared. Persistence is shortened when memory approaches overflow conditions. Lookup tables are used for determining row coordinates. Additional waveforms and graticule may be stored in display memory and displayed on the display screen at an intensity perceptibly different from the live waveform intensity.

20 Claims, 8 Drawing Sheets

AMPLITUDE MODULATED
SINEWAVE, .2 SECONDS
PERSISTENCE

AT START

AMPLITUDE MODULATED
SINEWAVE, .2 SECONDS
PERSISTENCE

.8 SECOND LATER

AMPLITUDE MODULATED
SINEWAVE, .2 SECONDS
PERSISTENCE 1.5 SECONDS LATER

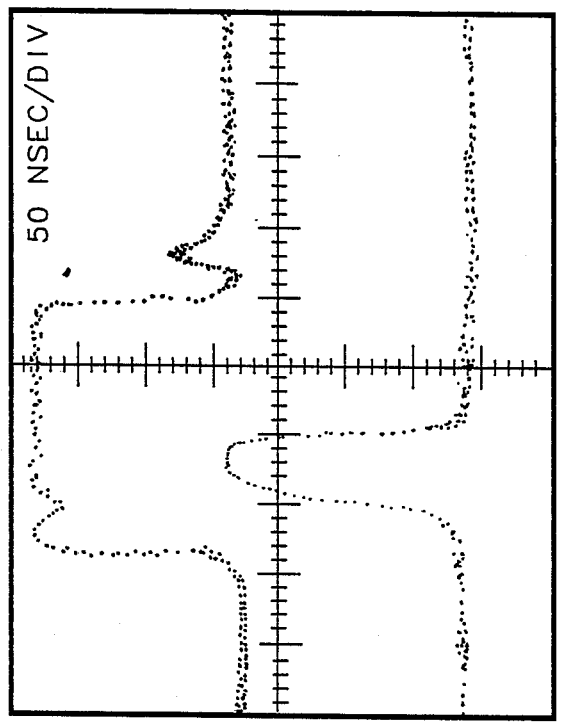
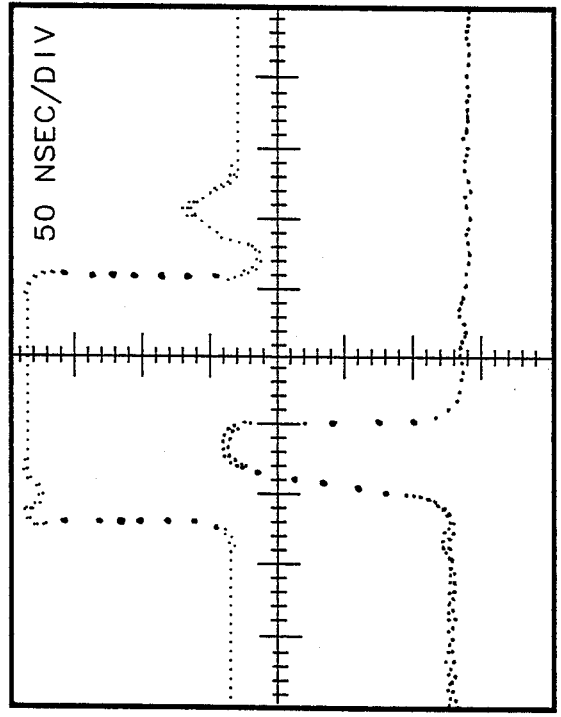

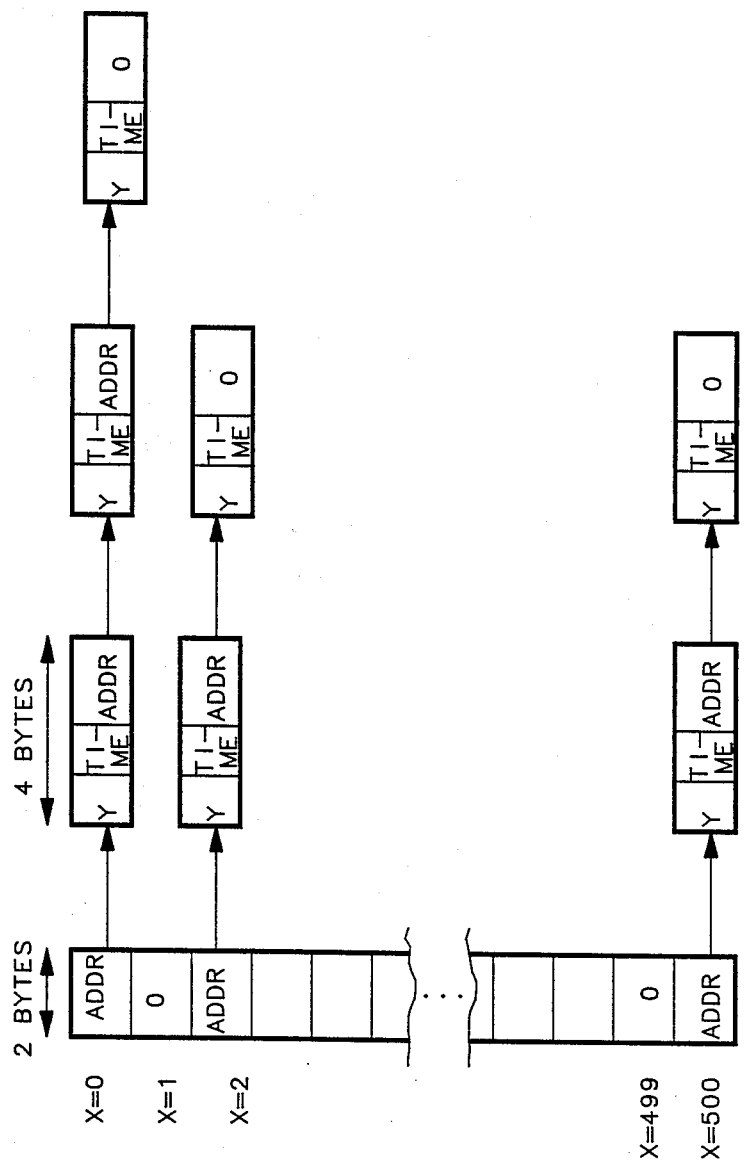

METHOD AND APPARATUS FOR ACHIEVING VARIABLE AND INFINITE PERSISTENCE

BACKGROUND OF THE INVENTION

This invention is concerned generally with digital oscilloscopes, and more specifically with methods and apparatus for achieving variable persistence and unlimited persistence of waveforms graphed on a repetitive sampling digital oscilloscope having a raster display. The variable persistence feature allows an oscilloscope user to control the length of time plotted points of the waveform under test will remain on the screen, enabling the user to perceive any changes in the waveform. Unlimited persistence allows the oscilloscope user to spot fault conditions which may occur infrequently or to monitor the extent of variations in the waveform over long periods of time.

Oscilloscopes are used for analyzing electronic equipment and locating fault conditions in the electronic equipment. An oscilloscope displays a graph of the voltage of an electronic signal versus time.

There are two major types of oscilloscopes, analog and digital. Analog oscilloscopes use an electrostatic or vector display. The display has three inputs referred to as X, Y, and Z. The voltage signal being measured is fed into the Y input and a ramp voltage is fed into the X input. The ramp represents the time variation. The Z axis is used to turn on the beam as it sweeps across the screen. The result is a X-versus-Y display where the voltage is displayed on the Y axis of the screen and time is displayed on the X axis of the screen.

A digital oscilloscope does not directly display the voltage signal as does an analog oscilloscope. A digital oscilloscope uses an analog-to-digital (A/D) converter to sample the voltage of the signal being measured. The output of the A/D converter is then used to create an X versus Y display of the data.

There are two types of digital oscilloscopes: single shot oscilloscopes and repetitive sampling oscilloscopes. With single shot oscilloscopes, the waveform is sampled only once. Once acquired, the waveform is displayed on the screen and remains there until the user wishes to make another acquisition. Some single shot waveforms continuously update the display. Each time a new waveform is captured, it replaces the last waveform on the display.

With repetitive sampling oscilloscopes, the waveforms are continuously sampled and displayed on the screen. Each time the waveform is sampled, more points are filled in on the displayed waveform. The advantage of repetitive sampling is that it allows the user to look at much higher bandwidth signals provided the signal repeats. Most digital oscilloscopes today are single shot oscilloscopes.

The two types of display technology currently available for oscilloscopes are vector displays and raster displays. All analog scopes use the vector technology, which was described above as having three inputs referred to as X, Y, and Z. The signal to be displayed may be either a stored signal, or a live signal. Some digital scopes use the vector technology, and others use the raster technology.

The raster display works by writing out the screen line by line starting from the top of the screen. The screen picture made up of discrete dots called pixels. The raster refreshed from a memory where each bit in the memory corresponds to a pixel.

variable persistence has been a feature in some analog scopes for many years. One commonly used scheme for implementing variable persistence in an analog oscilloscope used a storage mesh in the cathode ray tube between the screen and the electron gun. The mesh was charged to a negative potential. The incoming signal was written onto the storage mesh with a high velocity electron beam which disloged electrons from the mesh, raising potential of the storage surface where the beam struck. The image on the mesh was transferred to the screen by flooding the mesh with low velocity electrons. The low velocity electron were repelled by the negative charge on the screen but passed through the mesh where the high velocity electron beam had struck the mesh and disloged the electrons. The mesh was erased periodically by charging it up to a negative potential. The persistence of the trace was determined by controlling the length of the erase cycle such that the image was not entirely erased during each erase cycle.

The scheme had several problems. It had a finite persistence time because of free electrons floating around inside the tube which would gradually discharge the storage mesh and the picture on the screen would fade. The oscilloscope was generally difficult to use because a compromise had to be made between having a bright trace and avoiding blooming. The brighter the trace was, the wider it would become. Blooming occurred when the trace became so wide the whole screen became bright. Also, the analog storage oscilloscopes were expensive and did not have the resolution necessary to satisfactorily display characters.

Another storage technology used with analog oscilloscopes is bistable storage. The cathode ray tube of the bistable oscilloscope was coated with a phosphor which had two stable states: On and off. The phosphor was off initially and was turned on by the beam writing onto the inside surface of the cathode ray tube. The bistable oscilloscope had advantages of low cost and long persistence time, but had disadvantages of a very limited bandwidth compared to analog storage oscilloscopes, a persistence controllable only by erasing the entire screen, and poor contrast between the waveform and the background compared to analog storage oscilloscopes.

Variable persistence has never been used satisfactorily in analog oscilloscopes, because of the problems mentioned earlier with storage oscilloscopes.

Linked lists are a software scheme which have been well known in the industry for years. Typically, a linked list consists of several links and a pointer. The pointer has address of the first link and each link has the address of subsequent link. The last link in the list may contain an identifier such as a zero address indicating that it is the last link. One application was used in U.S. Pat. No. 3,972,026 by inventors Waitman and Lyman as a method of encoding data characters and control characters for refreshing a cathode ray tube display.

Lookup tables are also well known as a time saving device in software applications. Instead of computing a number according to a function every time it is needed, a table of computed numbers is created according to the function and is referred to as needed.

SUMMARY OF THE INVENTION

This invention consists of methods and apparatus for achieving variable persistence and unlimited persistence of waveforms from signals in systems under test. One preferred embodiment of this invention is a digital oscilloscope which can display sampled points of a changing waveform for a specified or unlimited amount of time.

A block diagram, FIG. 1, shows the basic structure of the apparatus for one embodiment. Block 10 represents the input circuitry and the sampler. The input circuitry contains attenuation and offset circuits to bring the signal within the range of the sampler and analog-to-digital (A/D) converters. The sampler performs a sample-and-hold (S/H) function.

Block 20 represents an A/D converter which converts the incoming analog signal to a digital number. The digital numbers are stored in a high speed memory represented by block 30. The acquisition cycle is over when a predetermined number of points have been acquired.

When the acquisition cycle is complete, the microprocessor, represented by block 50, reads the digital numbers out of the high speed memory and processes the points. If the embodiment of the invention is in the variable persistence mode, the microprocessor will update and maintain the linked lists and pool of spare links stored in the linked list memory, represented by block 40. These linked lists contain the location of the points on the display screen, which is represented by block 70, and the amount of time remaining for each point to be displayed. Updating and maintaining the lists consists of converting the digital numbers in high speed memory to point locations for the screen, adding the new points to the linked lists, decrementing time remaining for all points in the linked lists, and removing points with zero or less than zero time remaining from the linked lists. Adding and removing links to and from the linked lists is accomplished by using the pool of spare links. The computation of the point locations makes use of a precomputed lookup table for finding the Y-coordinate.

As the microprocessor processes the digital numbers and maintains the linked lists, it sets and clears bits in the display memory, represented by block 60, which correspond to pixels the corresponding bits to be set, and points erased from the list cause the corresponding bits to be cleared. The display memory is a dual-port memory, and the microprocessor changes bit values in the display memory when the display memory is not being accessed by the display circuitry for the continuous rewriting of the display. The constant refreshing of the display creates the appearance of a real time response for the user in this embodiment of the invention.

If the embodiment of the invention is in the unlimited persistence mode, then the digital numbers are converted to point locations on the display by the microprocessor, and the corresponding bits in the display memory are set. Once the points are set on the screen, they remain set until the user clears them. No linked lists are used.

After the points are processed, the microprocessor starts another acquisition cycle by allowing the high speed memory to acquire another set of points. The cycle continues until a user command stops the process.

FIGS. 2A-2C, FIGS. 3A and 3B, and FIGS. 4A-4C show examples of waveforms captured under variable persistence and unlimited persistence modes. The waveform in FIGS. 2A-2C is an amplitude modulated sinewave. The period of the modulation is approximately 5 seconds, and the persistence of time is set to 0.2 seconds. FIG. 2(a) shows the waveform at time=0, FIG. 2(b) shows the waveform at time=0.8 seconds, FIG. 2(c) shows the waveform at time=1.5 seconds. Each point acquired during the acquisition period is displayed for 0.2 seconds only. FIG. 3(a) shows a waveform acquired at a sweep time of 50 nsec/div (there are 10 divisions) with a persistence of 0.5 seconds. The waveform becomes much clearer in FIG. 3(b) when the persistence is increased to 5.0 seconds.

FIG. 4 shows an example of how data is acquired and plotted in the unlimited persistence mode. FIG. 4(a) shows the display screen after 1 acquisition, FIG. 4(b) shows the display screen after 2 acquisitions, and FIG. 4(c) shows the display screen after several acquisitions. The unlimited persistence mode allows a user to recognize repetitive waveforms which are very fast.

In one embodiment of the invention, the graticule and two other waveforms are stored in different sections of the display memory. They may be displayed on the display screen with the live waveform. The graticule and stored waveforms are displayed at different intensities in one embodiment to permit viewer discrimination by using high intensity drivers and low intensity drivers.

In one embodiment of the invention, the processing of information by the microprocessor includes shortening the persistence of the screen in the variable persistence mode to keep the number of points displayed within the limits of the memory provided for the linked lists.

DESCRIPTION OF THE FIGURES

FIGS. 3A and 3B show an example of improved waveform recognition with an increased persistence time.

FIG. 10 shows an array of linked lists having 512 elements, each element having a pointer and a linked list, each link containing a Y coordinate, a time remaining variable, and the address of the next link.

DESCRIPTION OF THE PREFERRED EMBODIMENT

Figure 1:
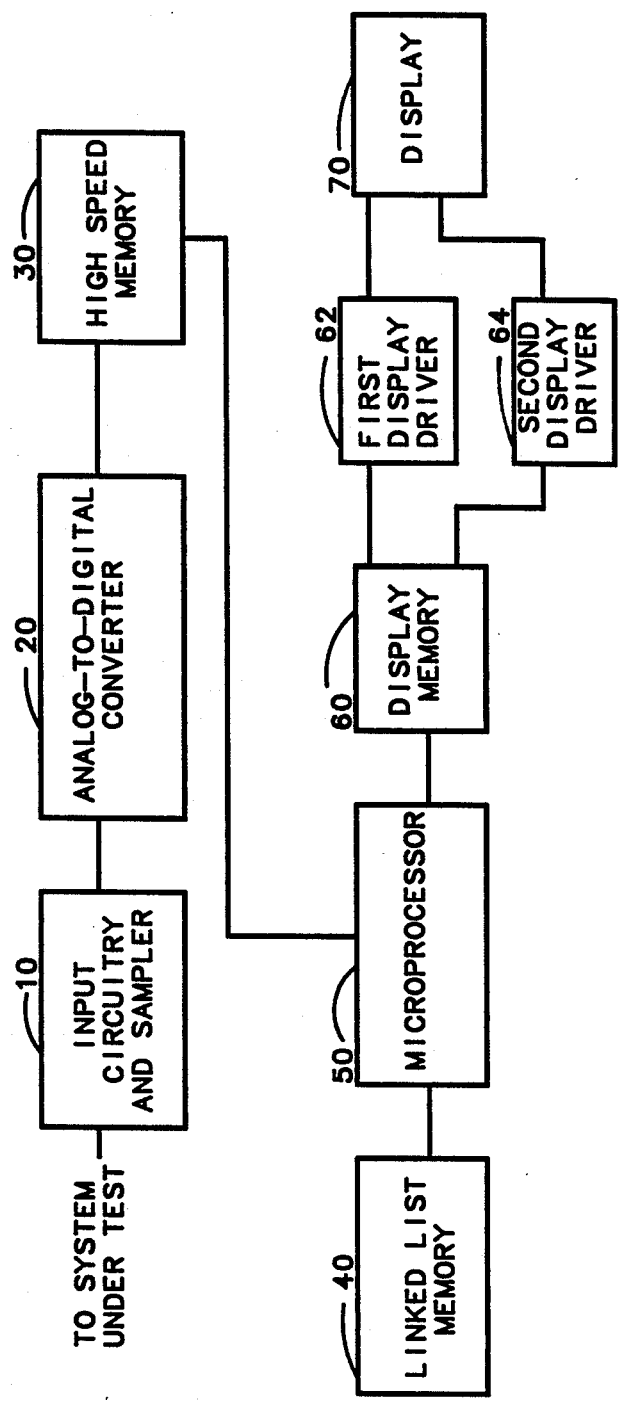
FIG. 1 shows a block diagram representing one embodiment of the invention.
Figure 2A:
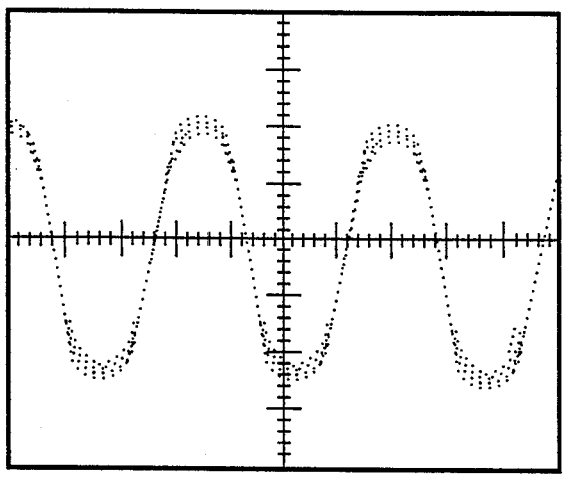
FIGS. 2A-2C show an example of an amplitude modulated waveform at different times using variable persistence.
Figure 2B:
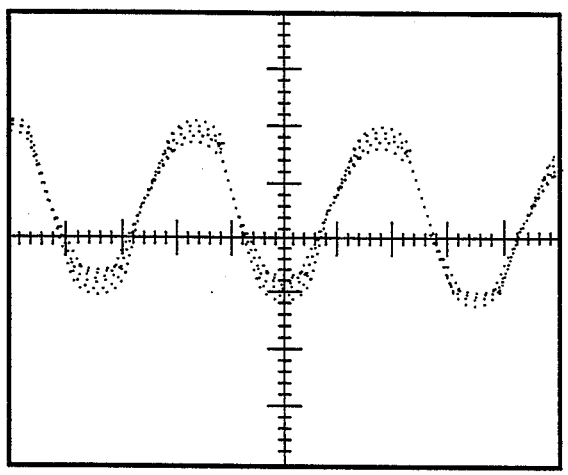
Figure 2C:
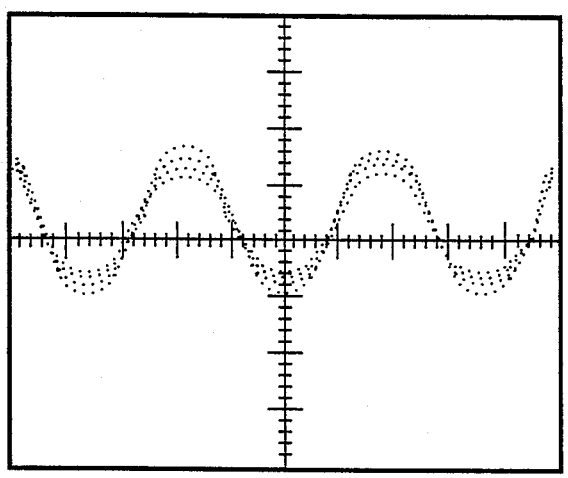

One preferred embodiment of the invention is represented by the block diagram in FIG. 1. Block 10 represents the input circuitry and the sampler. The input circuitry contains attenuation and offset circuits to bring the signal within the range of the sampler and the analog-to-digital (A/D) converter represented by block 20. The sampler performs a sample-and-hold function on the signal in the system under test. In one embodiment, the sample window is narrow enough to ensure a 1 GHz bandwidth. The sampler performs its function continuously.

The sampled data is then passed to the A/D converter, represented by block 20, and converted to digital numbers. In one embodiment, the sampled signals are converted to 7-bit digital numbers. These digital numbers represent the Y-value of the sampled signal. The A/D converter performs its function continuously.

The digital numbers are then passed to a random access high speed memory. This memory stores all the Y-values of the sampled data acquired during one acquisition period. For one embodiment, the high speed memory holds 1024 digital numbers. The acquisition period is the time period during which the points are sampled, converted to digital numbers, and stored in high speed memory. The acquisition period ends when the high speed memory is full of newly sampled numbers. After the acquired points are processed, a new acquisition period starts and a new set of points is acquired.

Block 50 represents a microprocessor in the block diagram in FIG. 1. The microprocessor is responsible for receiving the digital numbers from the high speed memory and processing them. The microprocessor controls the beginning and end of each acquisition period with gate hardware located between the A/D converter and the high speed memory. When the acquisition period is to begin, a flag bit on the microprocessor connected to a switch on the gate hardware is set and the gate hardware is activated. In one embodiment the hardware searches the input signal for a user-defined trigger. When the trigger is found, a delay counter waits for a user-defined period of time, then opens the gate between the A/D converter and the high speed memory, starting the acquisition period. When the high speed memory has acquired a complete set of data, the gate closes and a flag bit on the high speed memory connected to the microprocessor is set. The microprocessor then processes the digital numbers. The microprocessor is connected to the linked list memory, represented by block 40 in FIG. 1, and to the display memory, represented by block 60 in FIG. 1. The microprocessor is also connected to display circuitry located between the display memory and the display. The circuitry signals the microprocessor to allow the microprocessor to access the display memory when the display is not accessing the display memory. In one embodiment, the microprocessor is connected to a front panel from which the user defines the parameters for the oscilloscope, and has a local memory used for maintaining the status conditions of the oscilloscope. The microprocessor also is connected to a miscellaneous memory for performing various computations, and is responsible for storing and executing instructions used for implementing the method of achieving unlimited persistence and the method of achieving variable persistence.

Figure 4A:
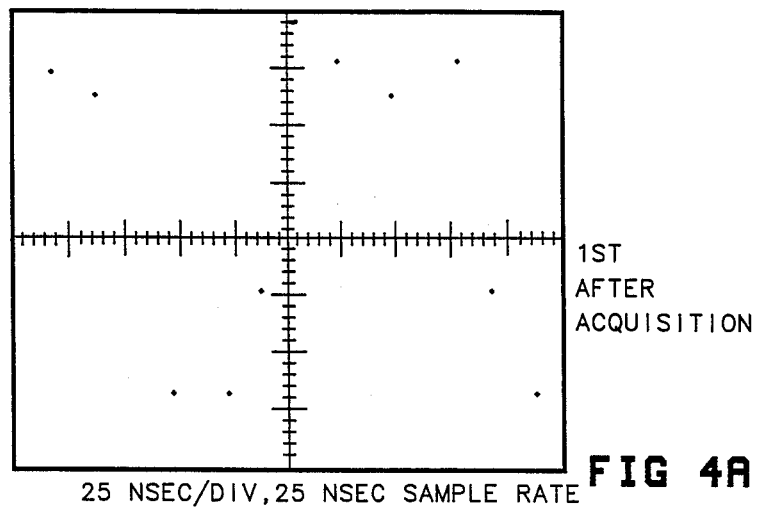
FIGS. 4A-4C show an example of different stages of data acquisition.
Figure 4B:
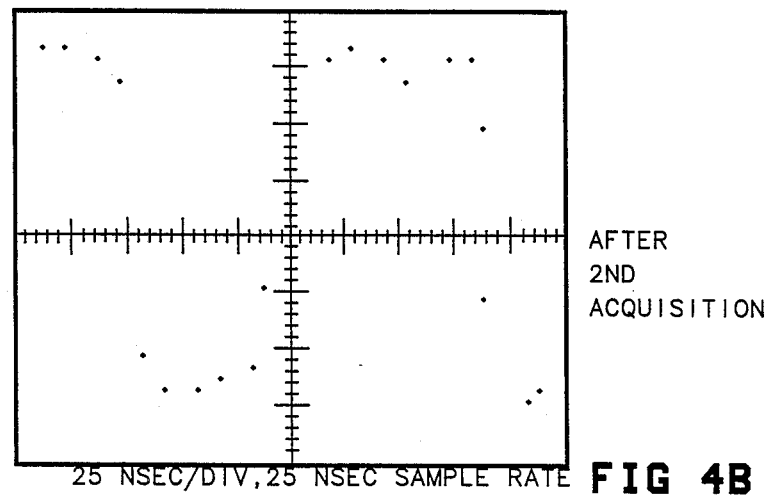
Figure 4C:
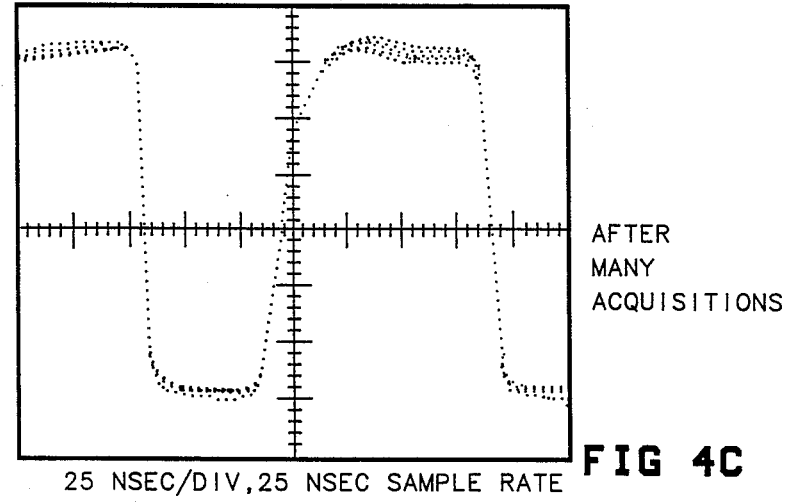

If the user sets the oscilloscope in the unlimited persistence mode, all points acquired during the acquisition period and all subsequent acquisition periods will be plotted on the display. No points will be erased until the user clears the screen. In one embodiment, the microprocessor accomplishes this by converting the acquired digital numbers into the appropriate X and Y coordinates for the display, which is represented by block 70 in FIG. 1. The coordinates are used to set the bit in the display memory which corresponds to the appropriate point on the display. In one embodiment, the points are pixels which may be turned on and off individually on a raster display screen. As more data is acquired, more information on the waveform is filled in on the raster display screen. An example of this is shown in FIG. 4, as explained earlier. The display circuitry drives the raster display screen based on the bits set in the display memory.

Figure 5:
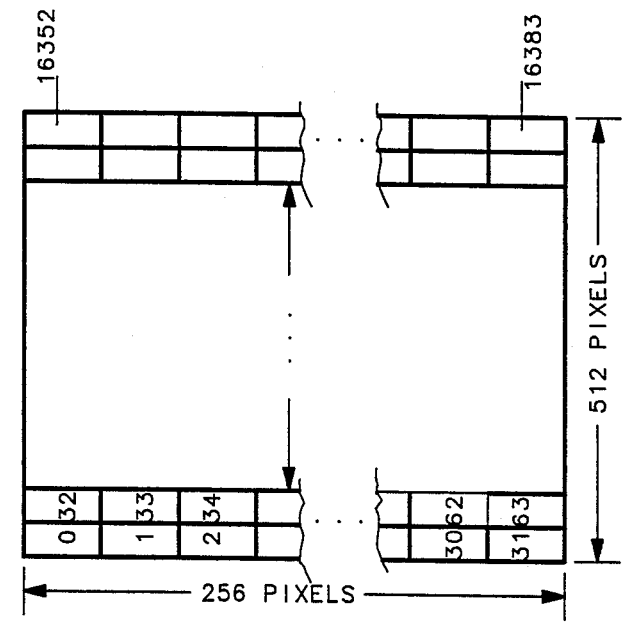
FIG. 5 shows one method of addressing pixels for one embodiment of the display.

The display memory, represented by block 60 in FIG. 1, is a dual-port random access memory. The memory is accessed by the microprocessor when bits are set or cleared, and by the display circuitry when the display is refreshed. In one embodiment, the display memory is divided into blocks of memory, each block corresponding to one set of information for a complete display. In one embodiment, the display memory has 4 blocks: The first block is used to store the live waveform, the second block is used to store the graticule, the third block and fourth block are each used to store other waveforms which can be looked at later or used for comparison with the live waveform. In one embodiment, each block of memory holds 16,384 bytes of information. This is used in conjunction with a raster display screen, 512 pixels wide by 256 pixels high. Each bit in a 16,384-byte block corresponds to one pixel on the raster display screen. One addressing scheme in FIG. 5 shows the correspondence between addresses in the display memory and the pixels on the raster display screen. The first column on the screen corresponds to bytes 0 through 31 in the display memory, and the last column on the screen corresponds to bytes 16,352 through 16,383 Each column on the screen is one pixel wide and each byte represents eight pixels in the column. In one embodiment, the pixel in the upper left corner is controlled by setting bit 7 of address 0, and the pixel in the lower right corner can be turned on by setting bit 0 of address 16,383. Similar addressing schemes are used for each remaining block of memory.

The display is refreshed by display circuitry which accesses the display memory and continuously rewrites the display based on the contents of the display memory. In one embodiment, the rewrite of the screen occurs approximately every 1/60th of a second. This is accomplished by continuously repeating a 3-stage cycle. During the first two stages the display circuitry accesses the display memory and refreshes the live waveform and the graticule on the raster display screen. The third cycle allows the microprocessor to access and update the display memory.

During the first stage, two bytes from the live waveform block of the display memory are loaded in parallel into a shift register. This shift register shifts the bits out serially to a high intensity driver for the raster display screen. The driver then lights up the appropriate bits on the raster display screen with a high intensity trace, based on the contents of the shift register. After the two bytes have been loaded, while the shift register is shifting out the bits, two bytes from the graticule display block are similarly loaded in parallel to a second shift register. This second shift register shifts the bits out serially to a low intensity driver for the raster display screen. The low intensity driver then lights up the appropriate bits on the display screen with a low intensity trace, based on the contents of the graticule display block in the display memory. The graticule is displayed as low intensity points, and the live waveform is displayed as high intensity points, allowing a user to easily discriminate between the live waveform and the graticule.

In one embodiment, other waveforms may be stored in the third and fourth blocks of the display memory. If a user desired to place a stored waveform on the display, the bytes sent to the second shift register are the logically ORed result of the appropriate memory block and the graticule memory block. The stored waveform is displayed with the graticule at the same intensity. The user may compare the low intensity stored waveform with the high intensity live waveform. The graticule memory block and the stored memory block remain unchanged.

The third stage of the 3-stage cycle occurs after the live waveform block and the graticule display block have been accessed. The display circuitry will not access the display memory for more bytes of live waveform until the first shift register has completed shifting its contents to the high intensity driver. During the period of time after the display circuitry has accessed the graticule display block of the display memory and before the display circuitry will access the live waveform block of the display memory again, the microprocessor is allowed to access the display memory and complete one display memory operation. The microprocessor sends a handshake signal to the display circuitry when the microprocessor has a pending display memory operation. When the display memory returns the handshake signal, the microprocessor completes the pending operation. If the microprocessor has more pending display memory operations, it sends another handshake signal to the display circuitry. The display circuitry responds when the third stage of the cycle occurs. In one embodiment, this 3-stage cycle takes approximately 800 nanoseconds, the time required for 16 shifts of a shift register at 50 nanoseconds per shift.

For the unlimited persistence mode, the microprocessor need only convert the acquired data to the appropriate X and Y coordinates for the display memory and set the appropriate bits. Variable persistence mode is more complicated because it also requires erasing those bits at a later time.

Figure 6:
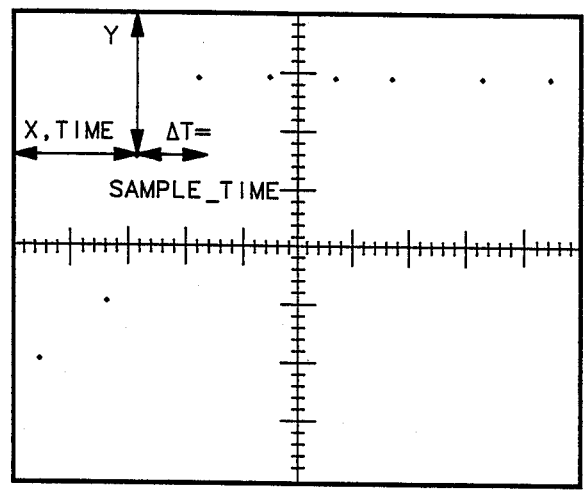
FIG. 6 shows the relationship between X, Y, and delta X in one method of computing the X and Y coordinates.

One method of computing the X and Y for the display memory is to compute the first X, corresponding to time, based on the knowledge of the relationship between the trigger and the first sample clock pulse. Once the first X is computed, the next X is found by adding a step corresponding to the sample time, the time between two samples. This step is dependent on the sampling rate set by the user. An example of this is shown in FIG. 6. The X corresponds to time, the delta X to the sample time, and the Y to the distance from the top of the screen.

In one embodiment, the X is tested to discover if it has advanced far enough to the right as to be off the screen. If it has, the plotting is terminated and a new acquisition period is started. In one embodiment, the oscilloscope has two channels, and the second channel is plotted after the first channel is done plotting before a new acquisition period is started. If the X is not off the screen, then the Y is computed.

The A/D converter value of Y is tested to see if it is overrange or incorrect because of top clipping. If it is, the Y is set to the maximum value for the screen. Once Y is set or if Y is not overrange, a previously computed lookup table is used to provide the appropriate Y for the display memory. In one embodiment the lookup table Y is an 8-bit digital number. The lookup table is used to convert the A/D converter value into a Y value for the display, while taking any user-defined enlargements into account. The lookup table for Y and the step increase for X make computation of the X and Y very fast.

The bit in memory which corresponds to the pixel on the screen must be set. The computed X defines the column in pixels and the computed Y defines the row in pixels. In one embodiment, the pixels on the screen correspond to the display memory as shown earlier in FIG. 5. The X is multiplied by 32 to find the top byte of the appropriate column since there are 32 bytes per column. The Y is divided by 8 since this will be the appropriate byte in the column, which is defined by the upper 5 bits of Y. Consequently, the expression $(X*32+Y/8)$ defines the correct display memory address by byte. The lower 3 bits of Y are used by the microprocessor to define which bit to set in the appropriate byte. In one embodiment using a Motorola 68000 for the microprocessor, this is accomplished with a BSET instruction. This is one method of setting the bit in the display memory that corresponds to the correct pixel on the raster display screen using the computed X and Y.

After the bit is set, the microprocessor returns and computes the next X by adding the sample time to the old X, and the next Y by using the next A/D converter Y value. This continues until the entire set of sampled points is plotted or until the X coordinate has advanced off the screen. Then a new acquisition period is started and a second set of points is plotted. This continues until the user stops the sampling. In one embodiment, the bits are set in the unlimited persistence mode by using the instruction set in Appendix A with a Motorola 68000 microprocessor.

The variable persistence mode is more complex than the unlimited persistence mode. Although the bits are set in the display memory as in the unlimited persistence mode, they must also be erased when the user-defined persistence time has passed. To enable this to occur, one embodiment uses an array of linked lists to keep track of the points on the screen and the amount of time remaining for each point before it is erased. In one embodiment, there is one linked list for each column on the display screen, or for each X point. The list has a link for each point which is set, each link containing the Y location and the time remaining before that point is to be erased. Links are added or subtracted from the linked lists as points are added or erased from the screen. Links not in linked lists are kept in a pool of spare links.

Figures 7A, 7B:
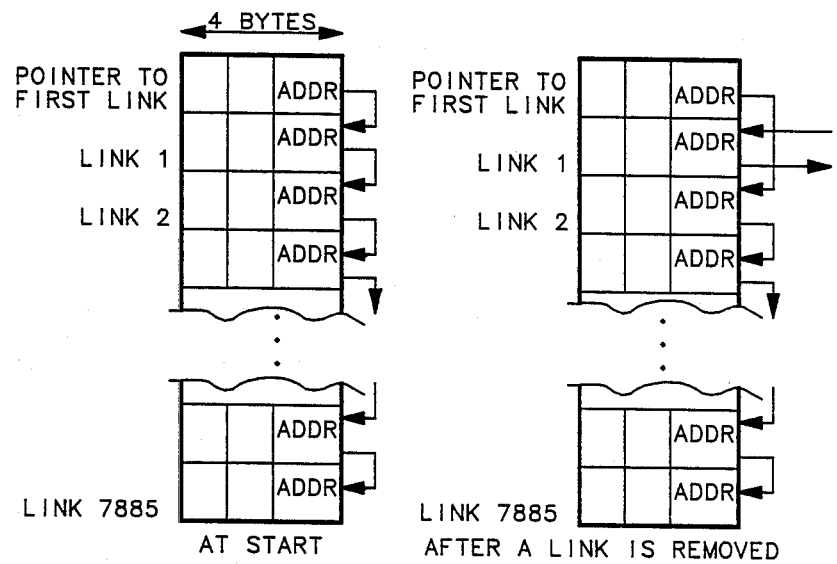
FIGS. 7A and 7B shows the format of a pool of spare links at initialization, and after a link is removed.

In one embodiment, an array of linked lists is initialized when the variable persistence mode is entered or when the screen is cleared by the user. The initializing process consists of three parts. The first part is setting to zero a counter which is used for counting the number of points displayed on the screen. Second, a 512 element array of column pointers is initialized to zero. There is a separate linked list for each column on the screen which keeps track of all the displayed points in the column. This array of column pointers points to the first link in each column linked list. The first element in the array corresponds to the column X=0, and the last element in the array corresponds to X=511. Each element in the array is initialized to zero. An address of zero indicates the end of the linked list. All the pointers are initially set to zero because there are no points displayed on the screen. Third, a pool of spare links is initialized to the format shown in FIG. 7(a) Each link is 4 bytes long and contains the address of the next link. In one embodiment, the pointer to the first link is at address 1024 and contains the address 1028. The first link is at address 1028 and contains the address 1032.

In one embodiment, the data for variable persistence is contained in an area of memory represented by block 40 in FIG. 1 which is 32,768 bytes long. Addresses 0 to 1023 contain the array of column pointers for 512 linked lists, and addresses 1024 to 32,563 contain 7885 4-byte links for the pool of spare links. In one embodiment the links are initialized by using the instruction set in Appendix B with a Motorola 68000 microprocessor.

Figure 8:
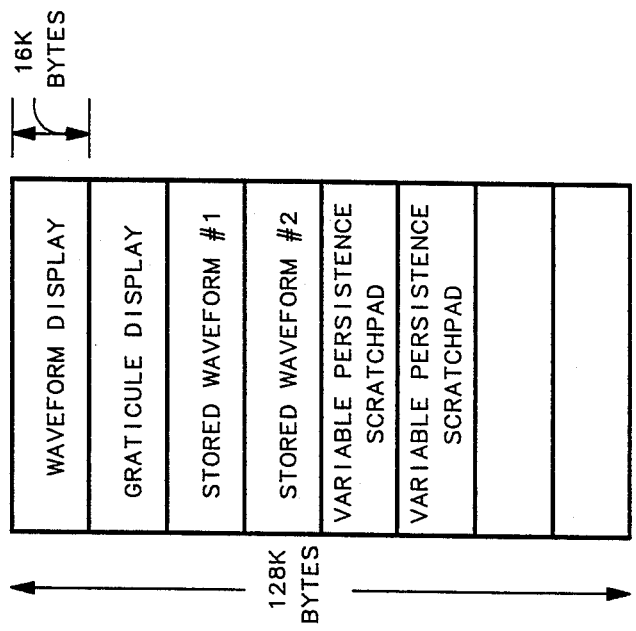
FIG. 8 shows the organization of display memory for one embodiment.

In one embodiment, the linked list memory is located in the same dual-port random access memory as the display memory. The memory is divided into 8 blocks, each 16,384 bytes long. The first block is for storing the live waveform, the second block is for storing the graticule, the third and fourth blocks are each for storing a waveform, the fifth and sixth blocks are for implementing variable persistence and contain the array of column pointers, the pool of spare links, and the linked lists, and the seventh and eighth blocks are for miscellaneous computations. An example of this is shown in FIG. 8. In one embodiment, when the microprocessor accesses the display memory, it may set or clear bits in the live memory block, perform linked list operations or complete other microprocessor functions.

Figure 9:
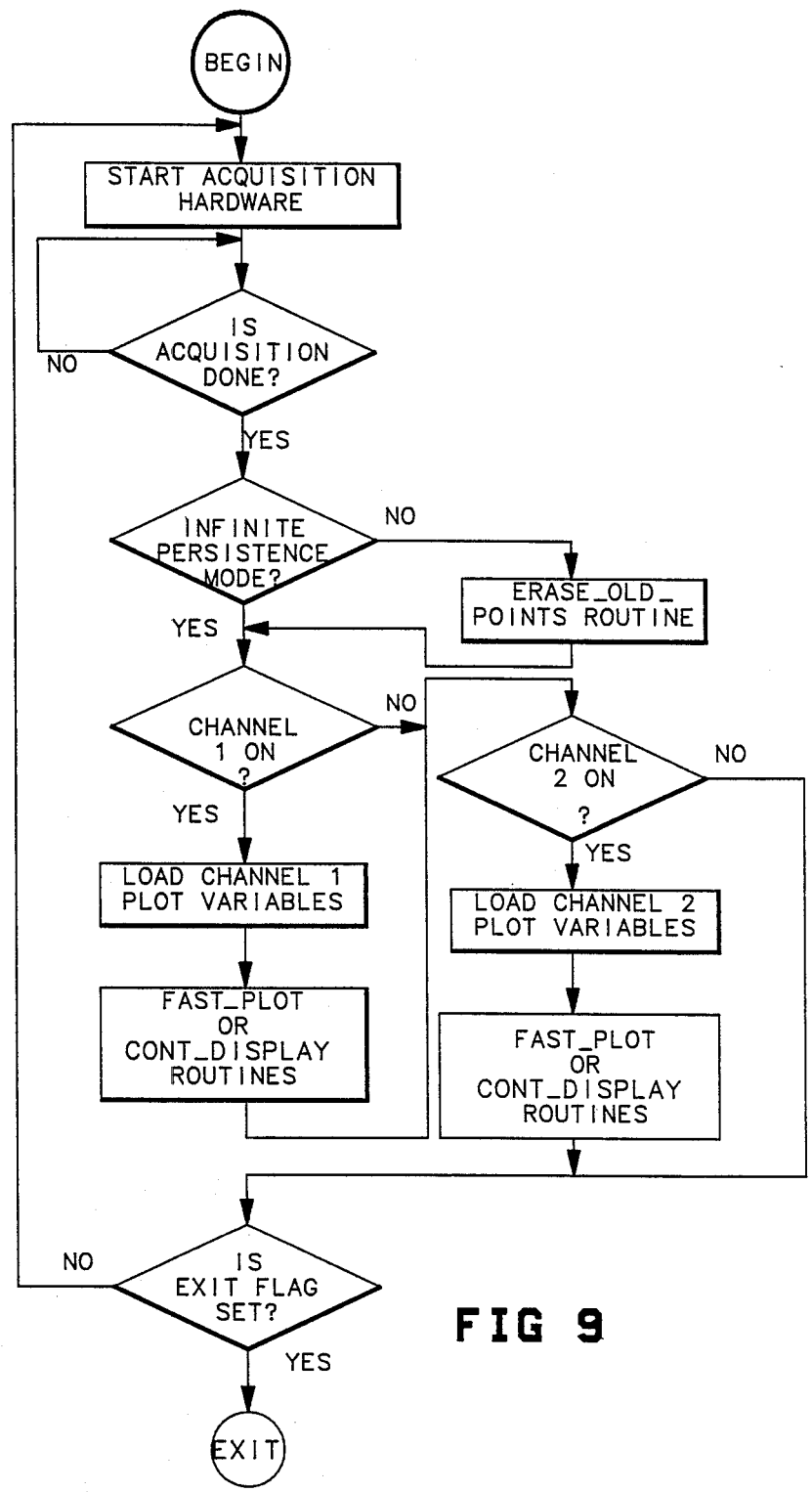
FIG. 9 shows a flowchart of an acquisition and display loop for a two-channel oscilloscope with both unlimited persistence and variable persistence mode available.

A flowchart for the acquisition and display loop for an oscilloscope having two channels is shown in FIG. 9. The link initialization has already taken place prior to the beginning of the loop. The acquisition of one set of data occurs first. Then a test is made to determine if the oscilloscope is in the unlimited persistence mode and the Erase_Old_Points routine is called if it is not.

In one embodiment, the erase routine begins by decrementing, by the amount of real time passed, all variables used for keeping track of the time remaining for the point before it is erased. Then all links having time remaining less than or equal to zero are removed from the linked lists and placed back in the pool of spare links. The bit corresponding to the X location of the linked list and the Y location of the link is cleared. The point will be erased from the screen when the display circuitry refreshes the raster display screen.

In one embodiment, there is another portion of the erase routine which is used if the number of points displayed on the screen becomes so large that there is a possiblity that the available memory will not be able to contain all the points. This is possible when the number of links which can fit into memory is less than the number of points on the display screen. If the memory is in danger of overflowing, the time distribution routine is called. This routine creates a set of counters, one for each possible different time remaining value. All the time remaining values are counted on these counters. Then the numbers on the counters are added together, one at a time, from the counter having the smallest time remaining value, to the counter having the highest time remaining value, till the value of the total of the counters subtracted from the total number of points displayed would bring the total number of points displayed below the danger level for screen overflow. The time remaining value of the last counter added is then used in the erase routine as the amount by which the time remaining values should be decremented, instead of the amount of time that has passed as is ordinarily done. The effect is to shorten the variable persistence time defined by the user to prevent the number of points displayed from overflowing the memory.

In one embodiment, the time distribution is computed and implemented by using the instruction set in Appendix C with a Motorola 68000 microprocessor. In one embodiment the erasing of points is accomplished by using the instruction set in Appendix D with a Motorola 68000 microprocessor.

The flowchart in FIG. 9 shows what follows the Erase_Old_Points routine. The process is the same for channel 1 or channel 2. If the channel is one, the plot variables are loaded. This prepares the oscilloscope for the Fast_Plot routine, used for unlimited persistence, or the Cont_Display routine, used for variable persistence. The Fast_Plot routine was explained earlier, as a method of implementing unlimited persistence. The Cont_Display routine is similar to the Fast_Plot routine, but has additional steps and is used for implementing variable persistence. When both channel 1 and channel 2 have been plotted, a check is made for an exit flag. If there is an exit flag, the process stops. If there is no exit flag, another acquisition period begins and another set of data is acquired.

The beginning of the variable persistence plotting process is similar to the beginning of the unlimited persistence plotting process. First, the X and Y coordinates are determined in the same manner as in the unlimited persistence mode. However, a bit in the display memory is not set as in the unlimited persistence mode.

Second, the linked list for the column X is searched to check if the point is in the list. An example of an array of linked lists is shown in FIG. 10. If the point is in the list, a new expiration time is set, and the X and Y coordinates are determined for a new point. The point is not plotted since it is already on the screen. If the point is not in the list, it is added in the third part of the process.

In the third part, a new point is added to the linked list. A free link is obtained from the pool of spare links. Next the Y value and the time remaining value are set in the new link. The time remaining value is what the user defined as the variable persistence time. Then the new link is added to the column linked list right after the pointer to the first link. The counter for the total number of displayed points is incremented. And finally, the bit in the display memory corresponding to the point is set just as in the unlimited persistence plotting process.

After the new point is added to the list, the X and Y coordinates for a new point are determined and the loop continues until all points have been processed or until the X coordinate is off the screen just as in the unlimited persistence plotting process. In one embodiment, the variable persistence plotting process was implemented using the instruction set Cont_Display shown in Appendix E with the Motorola 68000 microprocessor.

This invention represents the first time unlimited persistence has been used with a digital oscilloscope. The successful combination provides solutions to five main problems associated with digital oscilloscopes. First, the oscilloscope is able to continuously update the screen with new waveforms by using variable persistence, allowing the user to see changes in the waveform. The problem with achieving continuous updating in digital oscilloscopes was how to erase the old waveforms once they were stored in memory.

Second, the development of unlimited persistence offers improvements in measurement technology in three areas. First, catching infrequently occurring or single repetition waveforms; second, unattended monitoring is now available, and third, worst case measurements can be made. Unlimited persistence will allow a user to find all variations of the signal at any time.

Third, the use of variable persistence allows waveforms to be defined over a series of samplings. This improves the recognition possibilities for the user, and allows higher speed waveforms to be accurately sampled.

Fourth, variable persistence provides the ability to handle dynamic or changing waveforms. The problem with previous digital oscilloscopes was that they displayed the waveforms as single-valued functions, having one vertical point for every time point. Dynamic waveforms include multiple waveforms, aliased signals, envelope waveforms, and waveforms having jitter or noise which cause parts of the waveform to change.

Fifth, the unlimited persistence and variable persistence methods and apparatus provide a very fast screen update rate. This is necessary to provide the appearance of real time response to the user, to minimize the dead time, which is the time the oscilloscope spends displaying waveforms instead of searching for triggers, to decrease the time necessary for finding and displaying a problem waveform, and to increase the perceived bandwidth through the use of repetitive sampling.

The high speed at which the variable persistence mode and unlimited persistence mode plot points and update waveforms makes solutions to these problems possible. In one set of estimates for plotting and erasing points in an embodiment using a Motorola 68000 microprocessor with an 8 megahertz clock, 1000 points could be plotted in approximately 18 milliseconds in the unlimited persistence mode. In the variable persistence mode, it is estimated that approximately 20 microseconds are needed to process a point which is in the linked list, and approximately 41 microseconds to process and plot a point which is not in the linked list. The last two times assume that the answer is found on the first search through the list. Approximately 6 additional microseconds are estimated to be needed for each Y value in the linked list which is not a match.

For one example of plotting 1000 points of a waveform, it is assumed that 1000 points are already on the screen. Such a waveform would average approximately two points per column. Assuming that the waveform is fairly steady, and that only 5% of the points are changing, the total plot time can be estimated. The total plot time is the sum of three times. The approximate time needed to process the points already in the linked lists is 19.0 milliseconds ((1000 points−50 points) * 20 microseconds). The approximate time to process and plot the points not in the linked lists is 2.05 milliseconds (50 points * 41 microseconds). The approximate additional search time is 3.0 milliseconds (500 points * 6 microseconds—assuming a 50% chance of finding the point on the first search). The total estimated time to process a 1000-point waveform in the variable persistence mode is approximately 24.05 milliseconds, which compares very favorably with the 18 milliseconds estimated for plotting a 1000-point waveform in the unlimited persistence mode.

Some alternative approaches to achieving variable and unlimited persistence were investigated and rejected. The first approach stored points in a circular linked list in the memory, and wrote them to a screen after every acquisition period using a vector display. The newest points were written over the oldest points for each acquisition. The persistence was controlled by the number of points in the circular linked lists.

The approach had three main problems. First, the display memory was limited to the number of points which could be displayed without flicker. Second, a vector display can not operate in the unlimited persistence mode since it can only plot a limited number of points before flicker starts to occur. Third, the vector displays are expensive compared to the raster displays.

A second approach was to use a raster display with two display memories. One would be actively displayed and the other would be inactive. The waveforms would accumulate in the inactive display memory. After a user-specified time, the two memories would be switched so that the inactive display memory would become active and be displayed, and the active display memory would become inactive.

The main disadvantage for this approach was the wait for moderately long persistence times (one second or more) before the waveforms changed. The motion would appear jerky.

A third approach was a structure similar to the preferred embodiments but with a counter for each pixel, to keep track of the time remaining for each pixel. The disadvantage was the amount of memory required for the counters and the length of time required for searching for points and erasing the points.

A fourth approach was to keep records in memory for each waveform on the screen. After a user-specified time, the waveform and its record would be erased.

The disadvantages were the large amount of memory needed to keep track of the points, and the problem of erasing points from other waveforms which should not have been erased.

These approaches do not solve the problems associated with unlimited and variable persistence in digital oscilloscopes as well as the claimed invention.

APPENDIX A

FAST_PLOT PROCEDURE: Plots data in unlimited and variable persistence mode.

FAST_PLOT PROCEDURE - Gets input data from the A/D memory and plots it on screen.
A0 - Address of display memory
A1 - Address of Vertical table [1 ... 2,0 ... 255] array
A2 - Address to A/D data array
A3 - Long_delta_x (Step size)
A4 - Base address of linked list (variable pers. mode)
D0 - X (in pixels)
D1 - Bit to set in pixel memory
D2 - A/D value, Y value
D3 - Persistence time (Used for variable pers. mode)
D4 - Contains 00FFH - Used for masking

APPENDIX A-continued

FAST_PLOT PROCEDURE: Plots data in unlimited and variable persistence mode.

```
             A/D data
             D5 - Maximum Long_x value - (501 * 65536)
             D6 - Longx - X (in pixels * 65536)
             D7 - Loopcounter (Number_of_points counter)
Fast_plot    MOVEM.L   Plot_variables[A5],D2-D7/A0-A4  ; Get
                                                      ;routine variables
             SUBQ.W    #1,D2                          ;Is the plot Channel
                                                      ;1 or 2?
             BEQ.S     Fast_plot1                     ;Skip next instruc-
                                                      ;tions if Chan 1
             MOVEA.L   A_to_d_addr2[A5],A2            ;A2 - address of
                                                      ;Chan 2 A/D data
             ADD.L     #512,A1                        ;A1 - address of
                                                      ;Chan 2 Vert. table
Fast_plot1   CMP.L     D5,D6                          ;Is first point out
                                                      ;of range?
             BGT.S     Fast_plot5                     ;If yes, then exit
                                                      ;routine
             CMP.B     #101,D3                        ;Check for Unlimited
                                                      ;or Cont. mode
             BLE       Cont_display                   ;Branch if Contin-
                                                      ;uous Display mode
             Main Loop - calculate X and Y points and put up
             on display
Fast_plot2   MOVE.L    D6,D0                          ;D0 contains Long_x = X
                                                      ;* 65536
             ADD.L     A3,D6                          ;Longx = Long_x + Long_
                                                      ;delta_x
             SWAP      D0                             ;Lower word contains X
             MOVE.W    [A2]+,D2                       ;D2 contains A_to_d_data
                                                      ;[I]
             AND.W     D4,D2                          ;Mask off upper byte of
                                                      ;A_to_d data
             TST.B     D2                             ;Check if bit 7 is set
                                                      ;(overrange bit)
             BPL.S     Fast_plot3                     ;Skip if not set
             MOVE.W    #255*2,D2                      ;Set to max value
             BRA.S     Fast_plot4                     ;Skip next instruction
Fast_plot3   LSL.W     #2,D2                          ;Multiply D2 by 4
Fast_plot4   MOVE.W    0[A1,D2.W],D2                  ;Get Y value from Verti-
                                                      ;cal_table
             MOVE.W    D2,D1                          ;D1 also contains Y
             LSR.W     #3,D2                          ;D2 contains Y/8
             LSL.W     #5,D0                          ;D0 contain X * 32
             ADD.W     D2,D0                          ;D0 contains x*32 + Y/8
             BSET      D1,0[A0,D0.W]                  ;Set bit in display ram,
                                                      ;plot point
             CMP.L     D5,D6                          ;Is next point > maximum
                                                      ;x display point
             DBGT      D7,Fast_plot2
Fast_plot5   RTS
```

APPENDIX B

LINK_INIT ROUTINE

```
             LINK_INIT ROUTINE - Initializes the list of displayed
             points for the variable persistence mode.
Link_init    MOVE.L    Link_address[A5],A4            ;A4 - address of
                                                      ;linked list
             MOVE.W    #255,D7                        ;Loop counter
             CLR.L     D0                             ;Set D0 to zero
             MOVE.W    D0,Pixel_count[A5]             ;Set number of points
                                                      ;displayed = 0.
             Clear links for each X value (locations 0 . . . 1023,
                                  X = 0 to 511)
                 (Elements 501 thru 511 are set to 0, but are not
                 used)
Link_init1   MOVE.L    D0,[A4]+                       ;Clear pointer for
                                                      ;X column
             DBF       D7,Link_init1                  ;Branch until all links
                                                      ;are zero.
             Initialize Pool of Spare Links (locations 1024 . . .
             .32563)
             MOVE.W    #No_pixels_cntr,D7             ;Loop counter
             MOVE.L    #1028,D0                       ;Pointer for each link
Link_init2   MOVE.L    D0,[A4]+                       ;Write pointer for link
             ADDQ.W    #4,D0                          ;Increment pointer
             DBF       D7,Link_init2                  ;Branch until all links
```

APPENDIX B-continued
LINK_INIT ROUTINE

|  |  |  | ;are set |
|---|---|---|---|
|  | Return from subroutine |  |  |
| Link_init3 | RTS |  |  |

APPENDIX C
TIME DISTRIBUTION ROUTINE

TIME DISTRIBUTION ROUTINE - Entered when the pixel count is too large. This routine determines the distribution of expiration times, and based upon the distribution increases the elapsed time so that Erase routine erases sufficient points for the Pixel _count to fall below the constant, No_pixels (Number of Pixels).

```
              A1 - Pointer to distribution counters
              A4 - Base address of linked list
              D0 - First X value
              D1 - Pointer to X links
              D3 - Elapsed time since last erase
              D4 - Temporary register
              D5 - Pointer to next link
              D6 - Loop counter
              D7 - Number of X links
```

| Time_distribution: |  |  |  |
|---|---|---|---|
|  | MOVE.W | #50,D6 | ;D6 is loop counter |
|  | MOVEA.L | A4,A1 | ;A1 contains address of ;linked list |
|  | ADDA.L | #Dist_offset,A1 | ;A1 points to distribution ;memory |
|  | CLR.L | D4 | ;D4 is used to zero counter |
|  | Initialize distribution counters |  |  |
| Time_dist1 | MOVE.L | D4,[A1]+ | ;Zero two counters at a ;time |
|  | DBF | D6,Time_dist1 | ;Loop until all counters ;are zeroed |

Find distribution of expiration times. 100 counters are kept in memory for expiration times of .1 second to 10 seconds. This part of the routine scans the linked list of pixels points. For each point, the counter corresponding to the expiration time of the point is incremented.

| Time_dist2 | MOVEA.L | A4,A1 | ;A1 points to link bfr |
|---|---|---|---|
|  | ADDA.L | #Dist_offset,A1 | ;A1 points to distribution ;memory |
|  | MOVE.W | D0,D1 | ;D1 contains first X link |
|  | LSL.W | #1,D1 | ;Multiply X by 2 - for ;words |
|  | MOVE.W | D7,D6 | ;D6 is loop counter |
|  | Beginning of loop for new column list |  |  |
| Time_dist3 | MOVE.W | 0[A4,D1.W],D5 | ;Get pointer to first link |
|  | BEQ.S | Time_dist5 | ;Branch if pointer is zero |
|  | Scan column links, increment counter for each expiration time |  |  |
| Time_dist4 | MOVE.B | 1[A4,D5.W],D4 | ;Get pixel expiration time |
|  | LSL.W | #1,D4 | ;Multiply D4 by 2 - for ;words |
|  | ADDQ.W | #1,0[A1,D4.W] | ;Increment time counter |
|  | MOVE.W | 2[A4,D5.W],D5 | ;Get next pointer |
|  | BNE.S | Time_dist4 | ;Repeat loop until pointer ;= 0 |
|  | Increment X for next column |  |  |
| Time_dist5 | ADDQ.W | #2,D1 | ;Increment X value |
|  | DBF | D6,Time_dist3 | ;Decrement loop count ;until finished |

Set elapsed time according to the distribution, so that the number of pixels falls below the constant, No_pixels.

| Time_dist6 | CLR.W | D3 | ;D3 - pointer to distribu-;tion counters |
|---|---|---|---|
|  | CLR.W | D4 | ;D4 - pixel accumulator |
|  | MOVE.W | Pixel count[A5],D5 | ;Get pixel count |
|  | SUB.W | #No_pixels,D5 | ;D5 - no. of pixels exceed-;ing count |
| Time_dist7 | ADDQ.W | #2,D3 | ;Set D3 to point to next ;counter |
|  | ADD.W | 0[A1,D3.W],D4 | ;Add pixels to D4 |
|  | CMP.W | D4,D5 | ;Check points thus far in ;distribution |
|  | BGT.S | Time_dist7 | ;Branch until cutoff point |

APPENDIX C-continued
TIME DISTRIBUTION ROUTINE

|  |  |  |  |
|---|---|---|---|
|  |  |  | ;found |
|  | LSR.W | #1,D3 | ;D3 contains elapsed time |
|  | BRA | Erase1 | ;Return to the Erase ;routine |

APPENDIX D
ERASE ROUTINE

ERASE ROUTINE - Goes through linked list and decrements the time remaining for all the points. Points whose time has expired are deleted from the linked list and erased from the screen.
- A0 - Address of display memory
- A4 - Base address of linked list
- D0 - Current X value
- D1 - Bit to be set in display memory
- D2 - Current Y value
- D3 - Elapsed time since last erase
- D4 - Temporary register
- D5 - Pointer to next link
- D6 - Temporary register
- D7 - Loop counter Routine initialization

|  |  |  |  |
|---|---|---|---|
| Erase_old_points |  |  |  |
|  | MOVE.W | Elapsed_time[A5],D3 | ;Get elapsed time |
|  | BEQ.S | Erase | ;Skip if not zero |
|  | CLR.W | Elapsed_time[A5] | ;Set elapsed time back ;to 0 |
|  | TST.B | Run stop[A5] | ;Check if stopped |
|  | BNE.S | Erase0 | ;Do erase routine if ;not stopped |
| Erase | CMPI.W | #No_pixels,Pixel_count[A5] | ;Check number of ;pixels |
|  | BLT.S | Erase7 | ;Exit if not too many ;pixels on |
| Erase0 | MOVEA.L | Link_address[A5],A4 | ;Get address of linked ;list |
|  | MOVEA.L | Graphics_addr[A5],A0 | ;Get display address |
|  | MOVE.L | #Display_xmin,D0 | ;Initialize D0 to ;minimum X |
|  | MOVE.L | #Display_xmax,D7 | ;D7 is loop counter |
|  | SUB.W | D0,D7 | ;D7 contains number of ;X pixels |
|  | CMPI.W | #No_pixels,Pixel_count[A5] | ;Check number of ;pixels |
|  | BGE.S | Time_distribution | ;Branch if too many ;pixels on |
|  | Beginning of loop for new X column |  |  |
| Erase1 | MOVE.W | D0,D5 | ;Put X in D5 |
|  | LSL.W | #1,D5 | ;D5 points to the first ;X link |
|  | SUBQ.W | #2,D5 | ;Correct for offset of ;2 in links |
|  | Decrement expiration times for points in column list |  |  |
| Erase2 | MOVE.W | D5,D4 | ;Save address of last ;link |
| Erase3 | MOVE.W | 2[A4,D5.W],D5 | ;Get next link address |
|  | BEQ.S | Erase6 | ;Branch if 0 (last ;link in column) |
|  | SUB.B | D3,1[A4,D5.W] | ;Decrement time remain- ;ing |
|  | BHI.S | Erase2 | ;Repeat loop unless ;expired time |
|  | Time expired - erase pixel from screen |  |  |
|  | CLR.W | D2 | ;Clear upper and lower ;bytes of D2 |
|  | MOVE.B | 0[A4,D5.W],D2 | ;Get Y value from link |
| Erase4 | MOVE.W | D0,D6 | ;D6 will contain word to be set |
|  | MOVE.W | D2,D1 | ;D1 also contains Y |
|  | LSR.W | #3,D2 | ;D3 contains Y/8 |
|  | LSL.W | #5,D6 | ;D6 contains X*32 |
|  | ADD.W | D2,D6 | ;D6 contains X*32 + Y/8 |
|  | BCLR | D1,0[A0,D6.W] | ;Clear pixel |
|  | Delete link from list and put back in pool |  |  |
| Erase5 | MOVE.W | 2[A4,D5.W],2[A4,D4.W] | ;Link next link to ;last link |
|  | MOVE.W | 1026[A4],2[A4,D5.W] | ;Set link to point to ;old 1st link |

APPENDIX D-continued

ERASE ROUTINE

|       |           |                    |                              |
|-------|-----------|--------------------|------------------------------|
|       | MOVE.W    | D5,1026[A4]        | ;Put link back in pool<br>;as 1st link |
|       | MOVE.W    | D4,D5              | ;D4 is now last link         |
|       | SUBQ.W    | #1,Pixel_count[A5] | ;Decrement pixel<br>;counter |
|       | BRA.S     | Erase3             | ;Continue to check-<br>;expiration times |
|       | Increment X for next column |      |                              |
| Erase6 | ADDQ.W   | #1,D0              | ;Increment X value           |
|       | DBF       | D7,Erase1          | ;Decrement loop count<br>;until finished |
| Erase7 | RTS      |                    | ;Exit subroutine             |

APPENDIX E

CONTINUOUS DISPLAY ROUTINE

CONTINUOUS DISPLAY ROUTINE - Displays new points on screen. Updates the linked list for each point.
- A0 - Address of display memory
- A1 - Pointer to Vertical_table[1 ... 2,0 ... 255] array
- A2 - Pointer to A/D data array
- A3 - Samplerate_step (Delta Longx)
- A4 - Base address of linked list
- A5 - Base address of global data
- D0 - X (in pixels)
- D1 - Bit to set in pixel memory
- D2 - Current Y value
- D3 - Persistence time
- D4 - Contains 00FFH - Used for masking A/D data
- D5 - 501 times 65536
- D6 - Longx - X in pixels times 65536
- D7 - Loopcounter Compute X, Y coordinates of new data point

|              |          |                         |                                   |
|--------------|----------|-------------------------|-----------------------------------|
| Cont_display | MOVE.L   | D6,D0                   | ;D0 contains Longx = X<br>;* 65536 |
|              | ADD.L    | A3,D6                   | ;Longx = Longx + Sampler-<br>;ate_step |
|              | SWAP     | D0                      | ;Lower word contains X            |
|              | MOVE.W   | [A2]+,D2                | ;Get A/D data point               |
|              | AND.W    | D4,D2                   | ;Mask off upper byte of<br>;A/D data |
|              | TST.B    | D2                      | ;Check if bit 7 is set<br>;(overrange) |
|              | BPL.S    | Cont_disp0              | ;Skip if not set                  |
|              | MOVE.W   | #255*2,D2               | ;Set to max value                 |
|              | BRA.S    | Cont_disp1              | ;Skip next instruction            |
| Cont_disp0   | LSL.W    | #2,D2                   | ;Multiply D2 by 4                 |
| Cont_disp1   | MOVE.W   | 0[A1,D2.W],D2           | ;Get Y value from<br>;Vertical_table |
|              | Find X,Y coordinates in linked list |      |                      |
|              | LSL.W    | #1,D0                   | ;D0 contains X * 2                |
|              | MOVE.W   | 0[A4,D0.W],D1           | ;Get pointer to column<br>;list   |
|              | BEQ.S    | Cont_disp4              | ;Skip if pointer is 0             |
| Cont_disp2   | CMP.B    | 0[A4,D1.W],D2           | ;Compare link Y to<br>;current Y  |
|              | BNE.S    | Cont_disp3              | ;Skip is not equal                |
|              | MOVE.B   | D3,1[A4,D1.W]           | ;Set new expiration date          |
|              | BRA.S    | Cont_disp7              | ;Look for next point              |
| Cont_disp3   | MOVE.W   | 2[A4,D1.W],D1           | ;Get pointer to next link         |
|              | BNE.S    | Cont_disp2              | ;Branch unless last link          |
|              | Get link from pool and add on at beginning of column linked list |    |              |
| Cont_disp4   | MOVE.W   | 1026[A4],D1             | ;Get pointer to 1st link          |
|              | MOVE.W   | 2[A4,D1.W],1026[A4]     | ;Set pointer to next link         |
| Cont_disp5   | MOVE.B   | D2,0[A4,D1.W]           | ;1st byte of link<br>;contains Y  |
|              | MOVE.B   | D3,1[A4,D1.W]           | ;2nd byte contains ex-<br>;piration time |
|              | MOVE.W   | 0[A4,D0.W],2[A4,D1.W]   | ;Set up pointer to<br>;next link  |
|              | MOVE.W   | D1,0[A4,D0.W]           | ;Set up pointer to this<br>;link  |
|              | ADDQ.W   | #1,Pixel_count[A5]      | :Increment display point<br>;counter |
|              | Set pixel on display |             |                                   |
| Cont_disp6   | LSR.W    | #1,D0                   | ;D0 contains X                    |
|              | MOVE.W   | D2,D1                   | ;D1 also contains Y               |
|              | LSR.W    | #3,D2                   | ;D2 contains Y/8                  |

APPENDIX E-continued

CONTINUOUS DISPLAY ROUTINE

|  |  |  |  |
|---|---|---|---|
|  | LSL.W | #5,D0 | ;D0 contain X * 32 |
|  | ADD.W | D2,D0 | ;D0 contains X*32 + Y/8 |
|  | BSET | D1,0[A0,D0.W] | ;Set bit in display ram |
| Cont_disp7 | CMP.L | D5,D6 | ;Is next point > max X display point? |
|  | DBGT | D7,Cont_display | ;Branch until last point |
| Cont_disp8 | RTS |  | ;Exit subroutine |

I claim:

1. A method of achieving unlimited persistence of waveforms on a raster display screen for a digital oscilloscope comprising the steps of:
   (1) acquiring analog data from a signal in a system under test,
   (2) converting said analog data to digital data,
   (3) storing said digital data in a high speed memory,
   (4) setting bits in a display memory which correspond to pixels on said raster display screen, according to said digital data in said high speed memory,
   (5) refreshing said raster display screen continuously from said display memory whereby said refreshing occurs independently of steps (1) through (4),
   (6) repeating steps (1) through (4) sequentially without clearing said display memory until stopped by a first user command whereby all said bits set in said display memory remain set until cleared by a second user command.

2. A method of achieving unlimited persistence as in claim 1 wherein step (1) comprises the steps of:
   (A) bringing said signal within the voltage range of a sampler,
   (B) performing a sample and hold function with said sampler to acquire said analog data,
   (C) transferring said analog data to an analog-to-digital converter.

3. A method of achieving unlimited persistence as in claim 1 wherein step (3) comprises the steps of:
   (A) waiting until a user-defined trigger occurs for said signal,
   (B) counting a predetermined delay after said trigger occurs, then
   (C) opening a gate to allow said high speed memory access to said digital data, then
   (D) storing a specified number of points in said high speed memory, and
   (E) signaling a control apparatus after said points are stored.

4. A method of achieving unlimited persistence as in claim 1 wherein step (5) comprises the steps of:
   (A) reading a fist bit word out of said display memory into a first shift register by means of a first parallel port, then,
   (B) reading a second bit word out of said display memory into a second shift register by means of a second parallel port, then,
   (C) allowing said bits to be written to said display memory,
   (D) repeating step (A) through step (C) continuously,
   (E) shifting serially said bit word in said first shift register, to a first driver means for driving said raster display screen continuously,
   (F) shifting serially said bit word in said second shift register to a second driver means for driving said raster display screen, continuously,
   (G) refreshing pixels repetitively on said raster display screen according to said bit words used by said drivers.

5. A method of achieving unlimited persistence as in claim 1 wherein step (4) comprises the steps of:
   (A) computing the X-axis value for the first point of said digital data,
   (B) computing the X-axis value for all points subsequent to the first point of said digital data by adding a predetermined step increase to X-axis value.
   (C) computing the Y-axis value by looking up said Y-axis value in a precomputed lookup table according to said digital data,
   (D) selecting said bits according to said X-axis value and said Y-axis value, and (E) setting said bits.

6. A method of achieving unlimited persistence as in claim 4 wherein said first driver means drives said raster display screen at an intensity perceptibly different to a user from a given intensity at which said second driver means drives said raster display screen.

7. A method of achieving variable persistence of waveforms on a raster display screen for a digital oscilloscope comprising the steps of:
   (1) initializing linked lists and a pool of spare links in a display memory for maintaining a first set of point location data and a first set of time remaining data corresponding to said first set of point location data,
   (2) acquiring analog data from a signal in a system under
   (3) converting said analog data to digital data,
   (4) storing said digital data in a high speed memory, then,
   (5) decrementing time remaining datum in said first set of time remaining data in said linked lists, then,
   (6) removing links having time remaining datum less than or equal to zero from said first set of said time remaining data in said linked lists, and placing said links in said pool of spare links, then,
   (7) converting said digital data to a second set of point location data, then,
   (8) updating time remaining datum for links in said linked lists having point location datum substantially equal point location datum in said second set of point location data, then,
   (9) adding links to said linked lists from said pool of spare links for each point location datum in said second set of point location data not currently in a link in said linked lists, then,
   (10) setting bits in a second display memory according to said second set of point location data, then,
   (11) refreshing said raster display screen continuously from said second display memory,
   (12) repeating step (2) through step (10) sequentially until stopped by a user command, 8. A method of achieving variable persistence as in claim 7 wherein step (2) comprises the steps of:

(A) bringing said signal within the range of a sampler, then
(B) performing a sample and hold function with said sampler to acquire said analog data, then
(C) transferring said analog data to an analog-to-digital converter.

9. A method of achieving variable persistence as in claim 7 wherein step (4) comprises the steps of:
(A) waiting until a user-defined trigger appears for said signal,
(B) counting a delay after said trigger appears, then,
(C) opening a gate to allow said high speed memory access to said digital data, then,
(D) storing a specified number of points in said high speed memory, then,
(E) signaling a control apparatus after said points are stored.

10. A method of achieving variable persistence as in claim 7 wherein step (5) comprises the steps of:
(A) determining a minimum amount of time by which the predetermined variable persistence must be decreased to prevent a first number corresponding to the points displayed from reaching a second number corresponding to a predetermined maximum number of points displayed which is based on the amount of memory available for storing points to be displayed,
(B) setting a decremental value to the greater of said minimum amount of time and the amount of time current points have been displayed without having said time remaining datum decremented,
(C) decrementing said time remaining datum by said decremental value.

11. A method of achieving variable persistence as in claim 7 wherein step (7) comprises the steps of:
(A) computing the X-axis value for the first point of said digital data,
(B) computing the X-axis value for all points subsequent to the first point of said digital data by adding a predetermined step increase to the prior X-axis value,
(C) computing the Y-axis value by looking up said Y-axis value in a precomputed lookup table according to said digital data.

12. A method of achieving variable persistence as in claim 7 wherein said time remaining datum for said links added to said linked lists is initially set to a predetermined maximum variable persistence.

13. A method of achieving variable persistence as in claim 7 wherein step (11) comprises the steps of:
(A) reading a first bit word out of said second display memory into a first shift register parallelly, then,
(B) reading a second bit word out of said second display memory into a second shift register parallelly, then,
(C) allowing said bits to be written to said second display memory,
(D) repeating step (A) through step (C) sequentially,
(E) shifting serially said bit word in said first shift register to a first driver means for driving said raster display screen continuously,
(F) shifting serially said bit word in said second shift register to a second driver means for driving said raster display screen continuously,
(G) lighting pixels continuously on said raster display screen according to said bit words used by said drivers.

14. A method of achieving variable persistence as in claim 10, wherein step (A) comprises the steps of:
(i) initiallizing to zero a set of distribution counters corresponding to different values of time remaining datum in said first set of time remaining data,
(ii) incrementing corresponding distribution counter for each value of time remaining datum,
(iii) determining a third number corresponding to the number of points by which said first number must be decreased to prevent said first number from reaching said second number,
(iv) adding counter totals from counter for lowest time remaining datum to each of the next consecutive counters till sum reaches said third number,
(v) setting said minimum amount of time to a value corresponding to the last counter having a total added to said sum.

15. A method of achieving variable persistence as in claim 13 wherein said first driver means drives said raster display screen at an intensity perceptibly different to a user from a given intensity at which said second driver means drives said raster display screen.

16. Apparatus for implementing unlimited persistence or variable persistence in a digital oscilloscope, comprising:
sample means for sampling and holding analog data from a signal in a system under test,
converter means connected to said sampler means for converting said analog data to digital data,
first memory means connected to said converter means for storing said digital data,
second memory means for storing linked lists having point location data and time remaining data,
third memory means having storage locations for storing display states for a set of display points as defined by locations of points corresponding to point location data currently in said linked lists,
display means connected to said third memory means having specific display points corresponding to said storage locations in said third memory means for displaying points according to said display states of said third memory means,
microprocessor means connected to said first memory means, said second memory means, and said third memory means responsive to a user command selecting variable or unlimited persistence mode for creating, updating and maintaining said linked lists in variable persistence mode and for converting said digital data to corresponding display states in said third memory means in unlimited persistence mode.

17. Apparatus as in claim 16, wherein aid third memory means comprises:
waveform memory means for storing the current waveform,
graticule memory means for storing a screen graticule,
first storage memory means for storing a first waveform and
second storage memory means for storing a second waveform.

18. Apparatus as in claim 16, wherein said microprocessor means comprises:
processing means for processing data,
local memory means connected to said processing means for storing status conditions and local variables, front panel means connected to said processing means for manually changing said status conditions, gate switching means connected to said processing means, said converter means, and said first memory means for controlling access between said first memory means and said converter means.

19. Apparatus as in claim 16, wherein said display means comprises:

a raster display screen.

20. Apparatus as in claim 18, wherein said gate switching means comprises:

trigger means for generating a trigger when said signal crosses a predetermined reference level, counter means connected to said trigger means for counting a predetermined delay after said trigger is generated, gate means connected to said first memory means and said converter means for allowing access between said first memory means and said convertor means, switching means connected to said counter means and said gate means for opening said gate means after said predetermined delay is counted and for closing said gate means.

* * * * *

UNITED STATES PATENT AND TRADEMARK OFFICE
CERTIFICATE OF CORRECTION

PATENT NO. : 4,829,293
DATED : May 9, 1989
INVENTOR(S) : Rodney T. Schlater

It is certified that error appears in the above-identified patent and that said Letters Patent is hereby corrected as shown below:

Column 1, line 68, after "picture" insert -- is --

Column 2, line 1, after "raster" insert -- display is --

Column 2, line 3, "variable" should read -- Variable --

Column 2, line 11, after "raising" insert -- the --

Column 2, line 53, "has address" should read -- has the address --

Column 2, line 54, after "of" insert -- the --

Column 3, line 41, after "pixels" insert -- on the display. Points added to the linked list cause --

Column 22, line 41, after "under" insert -- test, --

Column 24, line 53, "aid" should read -- said --

Abstract, line 2-3, "samplier" should read -- sampler --

Signed and Sealed this

Twenty-first Day of August, 1990

Attest:

HARRY F. MANBECK, JR.

*Attesting Officer*     *Commissioner of Patents and Trademarks*